United States Patent
Wen et al.

(10) Patent No.: US 8,564,133 B2
(45) Date of Patent: Oct. 22, 2013

(54) CHIP PACKAGE AND METHOD FOR FORMING THE SAME

(76) Inventors: Ying-Nan Wen, Hsinchu (TW); Baw-Ching Perng, Baoshan Township, Hsinchu County (TW); Wei-Ming Chen, Hsinchu (TW); Shu-Ming Chang, Tucheng (TW)

(*) Notice: Subject to any disclaimer, the term of this patent is extended or adjusted under 35 U.S.C. 154(b) by 444 days.

(21) Appl. No.: 12/860,823

(22) Filed: Aug. 20, 2010

(65) Prior Publication Data
US 2011/0042819 A1    Feb. 24, 2011

Related U.S. Application Data

(60) Provisional application No. 61/235,648, filed on Aug. 20, 2009.

(51) Int. Cl.
*H01L 23/52* (2006.01)

(52) U.S. Cl.
USPC ........... 257/773; 257/774; 257/E21.584; 257/E23.174; 438/618; 361/764

(58) Field of Classification Search
USPC ........... 257/690, 773, 788, 774, E21.584, 257/E23.174; 361/764; 385/14; 438/618
See application file for complete search history.

(56) References Cited

U.S. PATENT DOCUMENTS

| | | | | |
|---|---|---|---|---|
| 5,612,576 A | * | 3/1997 | Wilson et al. | 257/788 |
| 2002/0019069 A1 | * | 2/2002 | Wada | 438/69 |
| 2002/0025587 A1 | * | 2/2002 | Wada | 438/15 |
| 2004/0155354 A1 | * | 8/2004 | Hanaoka et al. | 257/774 |
| 2005/0185880 A1 | * | 8/2005 | Asai | 385/14 |
| 2006/0012967 A1 | * | 1/2006 | Asai et al. | 361/764 |
| 2006/0131724 A1 | * | 6/2006 | Sato et al. | 257/690 |

FOREIGN PATENT DOCUMENTS

| CN | 1327263 | 12/2001 |
|---|---|---|
| CN | 101083244 | 12/2007 |
| CN | 101355069 | 1/2009 |
| CN | 101359650 | 2/2009 |

* cited by examiner

*Primary Examiner* — Eugene Lee
*Assistant Examiner* — Fang-Xing Jiang
(74) *Attorney, Agent, or Firm* — Liu & Liu

(57) ABSTRACT

According to an embodiment of the invention, a chip package is provided. The chip package includes a semiconductor substrate having an upper surface and an opposite lower surface, a through-hole penetrating the upper surface and the lower surface of the semiconductor substrate, a chip disposed overlying the upper surface of the semiconductor substrate, a conducting layer overlying a sidewall of the through-hole and electrically connecting the chip, a first insulating layer overlying the upper surface of the semiconductor substrate, a second insulating layer overlying the lower surface of the semiconductor substrate, and a bonding structure disposed overlying the lower surface of the semiconductor substrate, wherein a material of the second insulating layer is different from that of the first insulating layer.

22 Claims, 15 Drawing Sheets

US 8,564,133 B2

CHIP PACKAGE AND METHOD FOR FORMING THE SAME

CROSS REFERENCE

This Application claims the benefit of U.S. Provisional Application No. 61/235,648, filed on Aug. 20, 2009, the entirety of which is incorporated by reference herein.

BACKGROUND OF THE INVENTION

1. Field of the Invention

The present invention relates to a chip package, and in particular relates to a chip package having a variety of chips.

2. Description of the Related Art

Electronic products are developed to be lighter, thinner, shorter, and smaller. Semiconductor chips now tend to consist of multi-chip packages to achieve multi-function, and high performance requirements. A multi-chip package includes a variety of chips, such as logic chips, analog chip, control chips, or memory chips which are all integrated into a single chip package.

However, when more chips are integrated together, the size of the package cannot be reduced effectively if the chips are integrated two-dimensionally on a package substrate, such as a silicon substrate. Under these conditions, too much substrate area is occupied, which leads to increases in manufacturing cost. In addition, the speed of signal transmission in conventional packages is poor.

In addition, because a plurality of chips are integrated in a limited substrate area, disposing of the chips and reliability of the material of the chip package needs to be improved.

BRIEF SUMMARY OF THE INVENTION

According to an illustrative embodiment, a chip package is provided. The chip package includes a semiconductor substrate having an upper surface and an opposite lower surface, a through-hole penetrating the upper surface and the lower surface of the semiconductor substrate, a chip disposed overlying the upper surface of the semiconductor substrate, a conducting layer overlying a sidewall of the through-hole and electrically connecting the chip, a first insulating layer overlying the upper surface of the semiconductor substrate, a second insulating layer overlying the lower surface of the semiconductor substrate, wherein a material of the second insulating layer is different from that of the first insulating layer, and a bonding structure disposed overlying the lower surface of the semiconductor substrate.

According to an illustrative embodiment, a method for forming a chip package is provided. The method includes providing a semiconductor substrate having an upper surface and an opposite lower surface, forming a through-hole in the semiconductor substrate, the through-hole penetrating the upper surface and the lower surface of the semiconductor substrate, forming a conducting layer on a sidewall of the through-hole, the conducting layer extending overlying the semiconductor substrate, disposing a chip overlying the upper surface of the semiconductor substrate, the chip electrically coupled with the conducting layer, forming a first insulating layer overlying the upper surface of the semiconductor substrate, forming a second insulating layer overlying the lower surface of the semiconductor substrate, wherein the second insulating layer has a material different from that of the first insulating layer, and disposing a bonding structure overlying the lower surface of the semiconductor substrate.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

It is understood, that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numbers and/or letters in the various examples. This repetition is for the purpose of simplicity and clarity and does not in itself dictate a relationship between the various embodiments and/or configurations discussed. Furthermore, descriptions of a first layer "on," "overlying," (and like descriptions) a second layer include embodiments where the first and second layers are in direct contact and those where one or more layers are interposing the first and second layers.

Figure 1A:
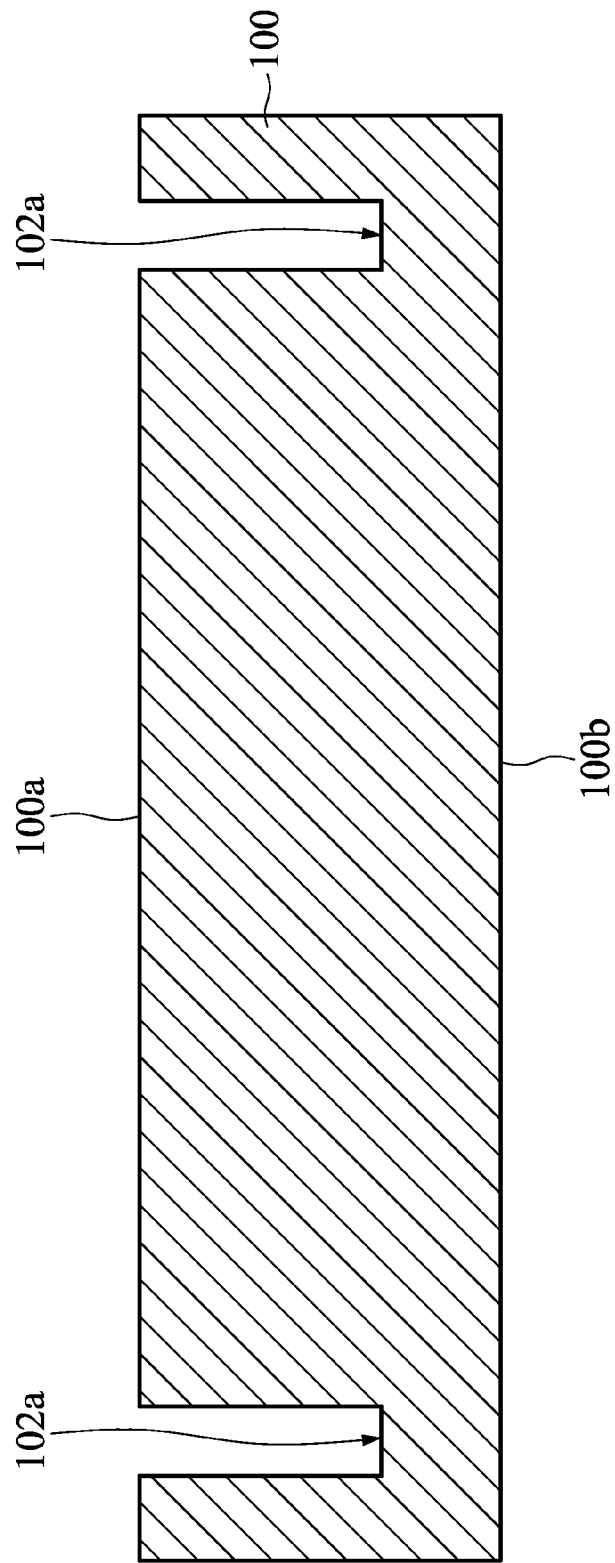
FIGS. 1A-1K are illustrative cross-sectional views showing the steps of forming a chip package according to an embodiment of the present invention.

FIGS. 1A-1K are illustrative cross-sectional views showing the steps in forming a chip package according to an embodiment of the present invention. Referring to FIG. 1A, a semiconductor substrate 100 is provided, which includes an upper surface 100a and an opposite lower surface 100b. The semiconductor substrate 100 may include a silicon substrate, silicon wafer, or other semiconductor substrate. Alternatively, the semiconductor substrate may also be a semiconductor chip, such as a logic chip, micro electro mechanical system (MEMS) chip, micro fluidic system chip, physical sensor chip for detecting physical changes such as detecting heat, light, or pressure, RF device chip, accelerator chip, gyroscope chip, micro actuator chip, surface acoustic wave device chip, pressure sensor chip, ink printer head chip, light emitting device chip, or solar cell chip.

Figure 1B:
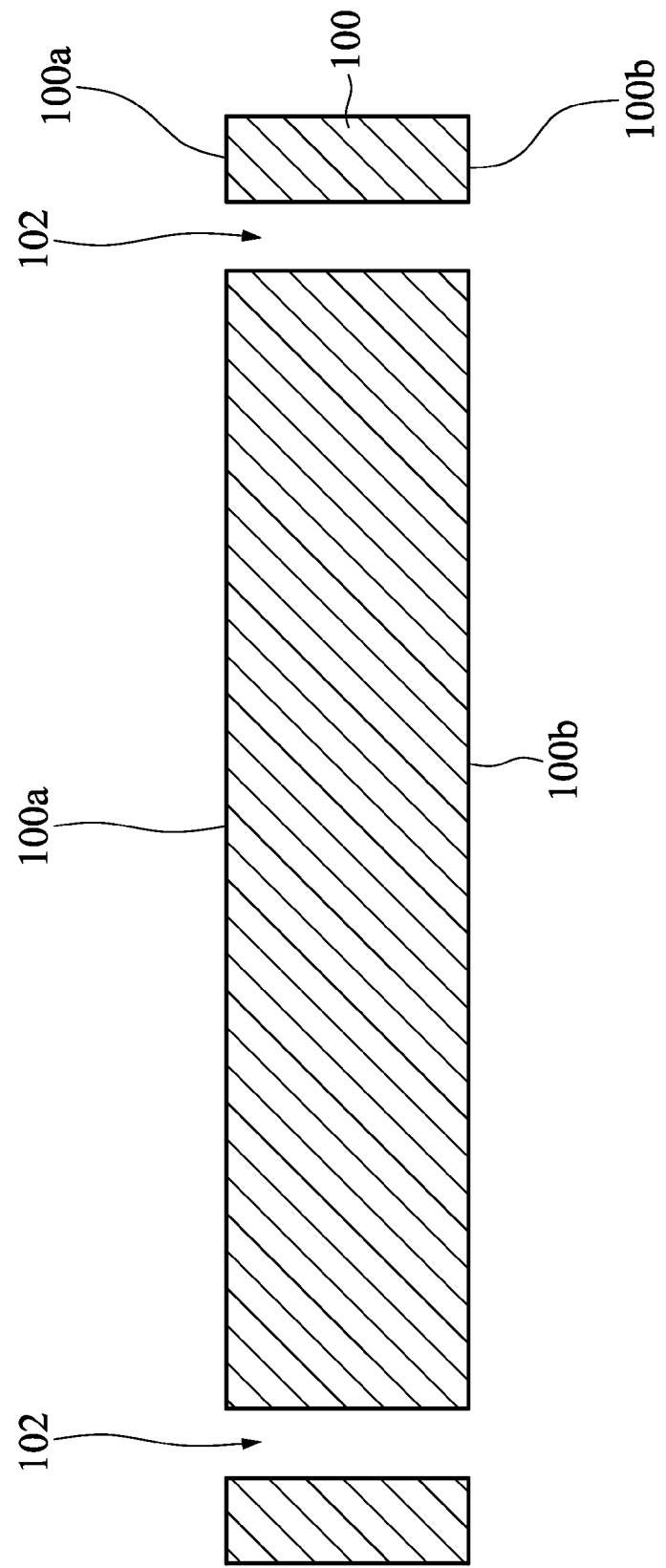

Then, a through-hole penetrating the upper surface and the lower surface is formed in the semiconductor substrate. In one embodiment, a through-hole penetrating through the upper surface and the lower surface may be formed directly by, for example photolithography and etching processes. Alternatively, as shown in FIGS. 1A and 1B, a hole 102a penetrating from the upper surface 100a toward the lower surface 100b of the semiconductor substrate 100 is formed first. Then, the semiconductor substrate 100 is thinned from the lower surface 100b of the semiconductor substrate 100 to expose the hole 102a, thus forming the through-hole 102. That is, the through-hole 102 penetrating the upper surface 100a and the lower surface 100b of the semiconductor substrate 100 is formed by a two-steps process including an etching process and a following thinning process. Although the sidewall of the through-hole 102 shown in FIG. 1B is substantially perpendicular to the upper surface 100a and the lower surface 100b, embodiments of the invention are not limited to a specific example. In another embodiment, through adjusting the process factors, such as choosing the etchant and/or etching method, the sidewall of the through-hole 102 may incline to the upper surface 100a and/or the lower surface 100b, depending on the requirement.

Figure 1C:
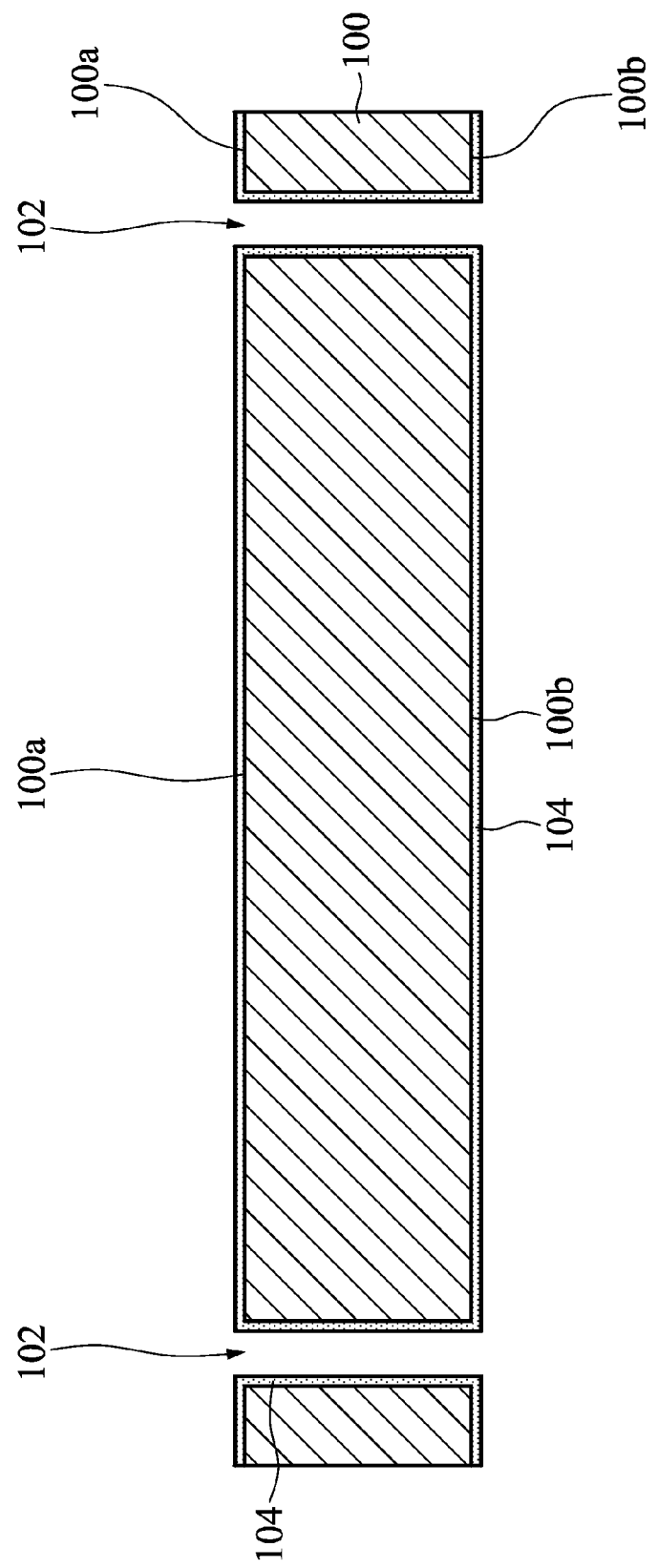

Referring to FIG. 1C, because a conducting layer will be formed on the sidewall of the through-hole 102 in the following process, a dielectric layer 104 may be formed on the sidewall of the through-hole 102 to prevent a short or a cross contamination from occurring between the conducting layer and the semiconductor substrate 100. However, it should be appreciated that the formation of the dielectric layer 104 is not necessary but optional. The dielectric layer 104 may be formed by a chemical vapor deposition method, thermal oxidation method, or coating method. In the embodiment shown in FIG. 1C, the dielectric layer 104 is formed on the exposed surface of the semiconductor substrate 100 by a thermal oxidation method. The dielectric layer 104 may include a silicon oxide or other oxides of semiconductor materials. In another embodiment, the dielectric layer 104 may include, for example an oxide, nitride, oxynitride, polymer material, or combinations thereof.

Figure 1D:
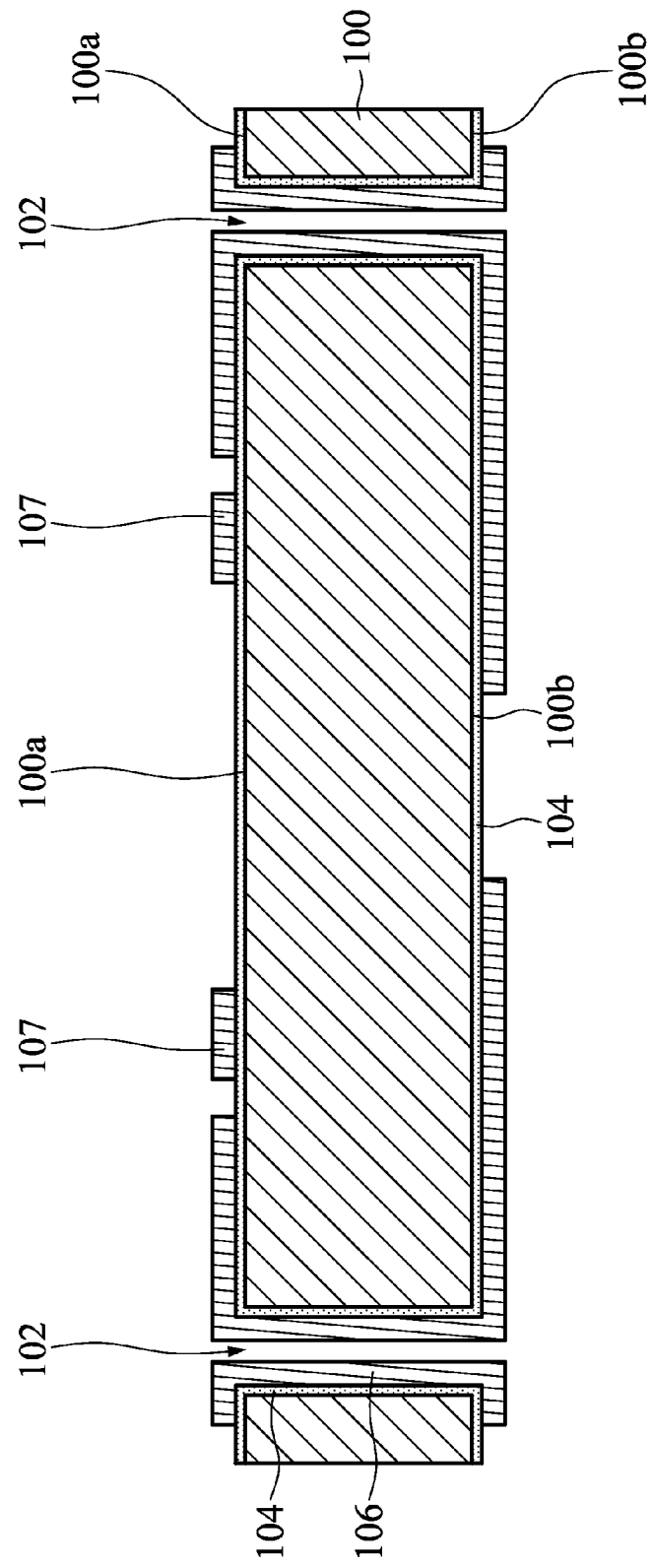

Then, a conducting layer 106 is formed on the sidewall of the through-hole 102. As shown in FIG. 1D, the conducting layer 106 is not only formed on the sidewall of the through-hole, but also extends overlying the upper surface 100a and the lower surface 100b of the semiconductor substrate 100 in this embodiment. The conducting layer 106 may be formed by a physical vapor deposition, chemical vapor deposition, electroplating, or electroless plating. The material of the conducting layer 106 may be a metal such as a copper, aluminum, gold, or combinations thereof. The conducting layer 106 may include a conducting oxide, such as an indium tin oxide (ITO), indium zinc oxide (IZO), or combinations thereof. In one embodiment, a conducting layer is conformally formed on the entire semiconductor substrate 100. Then, the conducting layer is patterned as shown in FIG. 1D.

Then, a self-aligned wall 107 is formed on the surface of the substrate 100 where a chip is to be disposed, such as the upper surface 100a. The self-aligned wall 107 facilitates the chip disposed on the semiconductor substrate 100 in the following process to be automatically and precisely located at the predetermined position. As shown in FIG. 1D, in this embodiment, the self-aligned wall 107 is preferably formed by patterning the same conducting layer used for forming the conducting layer 106. Therefore, in this embodiment, the self-aligned wall 107 and the conducting layer 106 are formed simultaneously. Both the self-aligned wall 107 and the conducting layer 106 include a conducting material. In another embodiment, the self-aligned wall 107 may be formed in an independent process without being formed in the same process used to form the conducting layer 106. In this situation, the material of the self-aligned wall 107 may be different from that of the conducting layer 106. The self-aligned wall 107 may include a metal material, ceramic material, polymer material, semiconductor material, or combinations thereof.

Figure 1E:
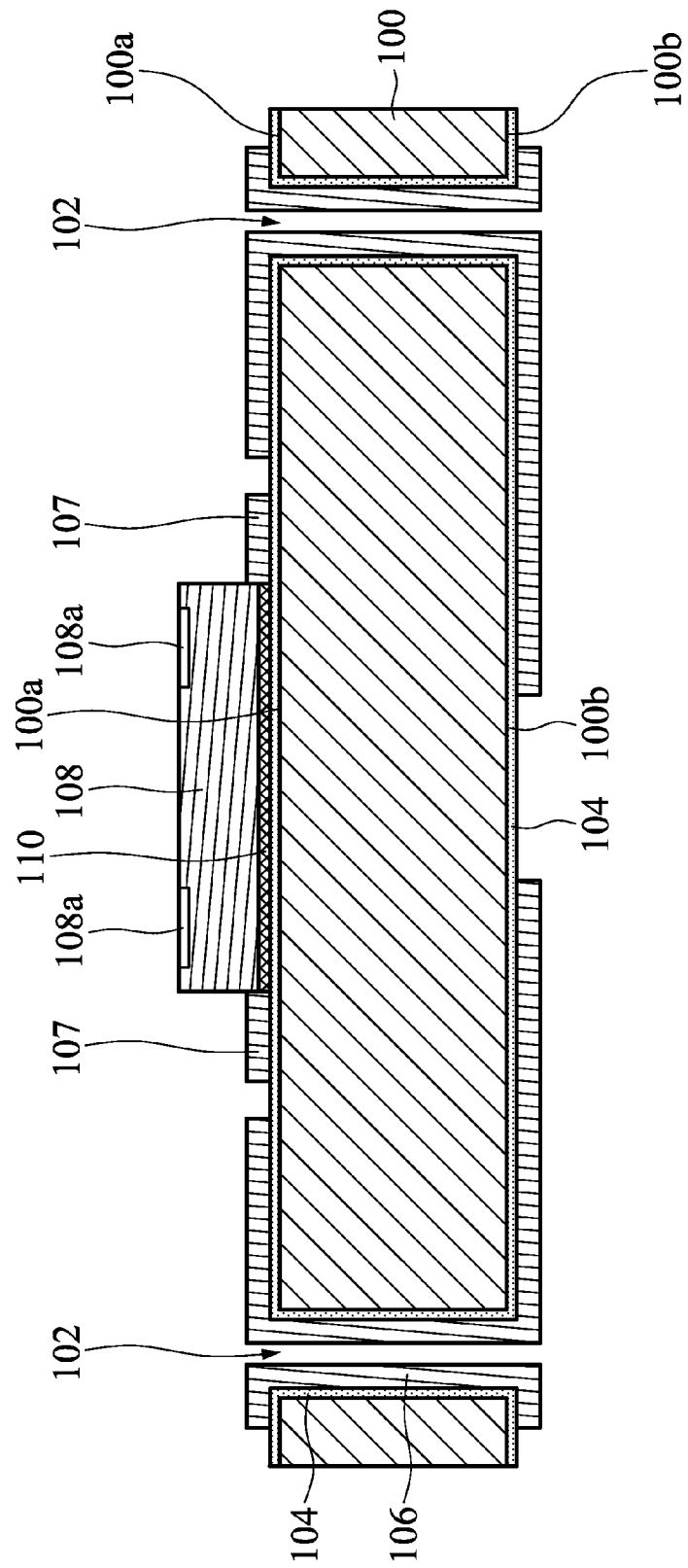

Then, a chip 108 is disposed overlying the upper surface 100a of the semiconductor substrate. As shown in FIG. 1E, the chip 108 may be fixed on the upper surface 100a of the semiconductor substrate 100 by an adhesive layer 110 between the chip 108 and the semiconductor substrate 100. The chip 108 may include, for example a logic chip, micro electro mechanical system (MEMS) chip, micro fluidic system chip, physical sensor chip for detecting physical changes such as detecting heat, light, or pressure, RF device chip, accelerator chip, gyroscope chip, micro actuator chip, surface acoustic wave device chip, pressure sensor chip, ink printer head chip, light emitting device chip, or solar cell chip. The chip 108 may include at least a bond pad 108a used for electrically connecting with other circuits or devices.

Because a relatively high temperature may be applied during the manufacturing process of the chip package, the adhesive layer 110 may become fluid such that the chip 108 may become movable and diverge from the predetermined position, which may lead to failure of the packaging of the chip. In the embodiment shown in FIG. 1E, because the self-aligned wall 107 is formed in advance, the movement of the chip 108 is limited in the region restricted by the self-aligned wall 107, thus smoothing the packaging process of the chip.

Relative positions and disposition types between the self-aligned wall 107 and the chip 108 may have many variations. Within the scope of the embodiments of the invention, the self-aligned wall 107 may be disposed in a way which can prevent the chip 108 from diverging from the predetermined position too much when the adhesive layer 110 is relatively fluid due to the high temperature process. For example, FIGS. 2A-2C are illustrative top views showing the dispositions of the self-aligned wall 107 and the chip 108 according to embodiments of the present invention.

Figure 2A:
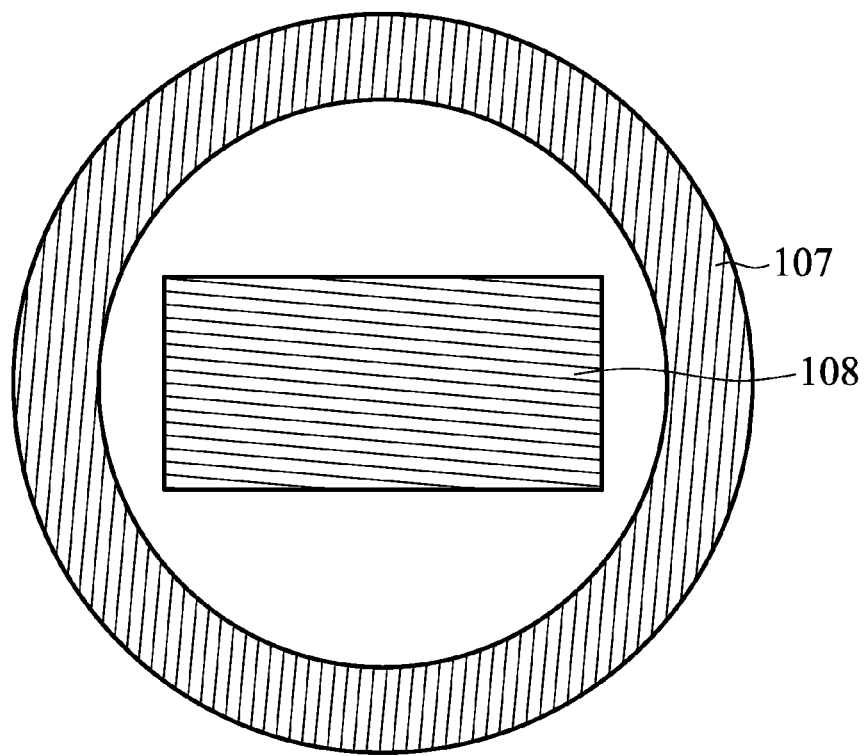
FIGS. 2A-2C are illustrative top views showing the dispositions of the self-aligned wall and the chip according to embodiments of the present invention.
Figure 2B:
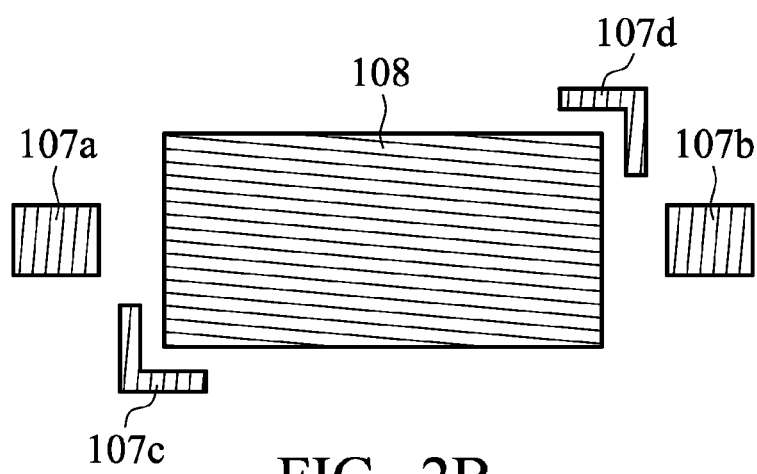
Figure 2C:
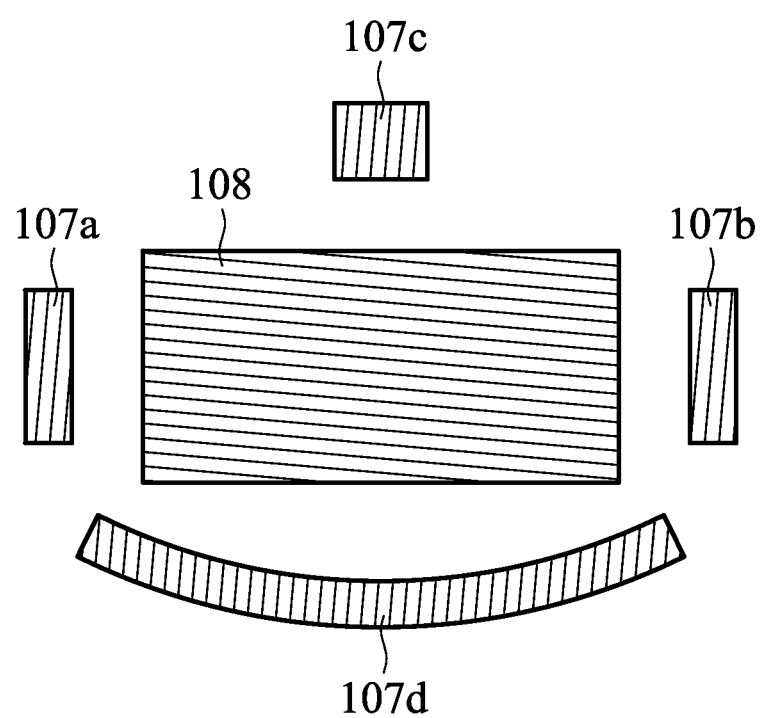

As shown in FIG. 2A, the self-aligned wall 107 is adjacent to or slightly in contact with the chip 108. In one embodiment, the self-aligned wall 107 is a continuous structure, such as a ring structure surrounding the chip 108 to prevent the chip from diverging from the predetermined position too much. As shown in FIG. 2B, in another embodiment, the self-aligned wall 107 is a discontinuous structure comprising at least a first portion 107a and a second portion 107b without connecting with the first portion 107a. In this embodiment, the first portion 107a and the second portion 107b are disposed beside the chip 108 and opposite to each other, which is capable of preventing the chip from diverging from the predetermined position too much. In addition, in another embodiment, the self-aligned wall 107 may include a third portion 107c and a fourth portion 107d, which may be disposed near corners of the chip 108, such as the L-shaped structures for holding the chip from diverging too much. As shown in FIG. 2C, in yet another embodiment, the self-aligned wall 107 is a discontinuous structure and includes a plurality of portions. In this embodiment, these portions consist of first, second, third, and fourth portions 107a, 107b, 107c, and 107d. Shapes of these portions may be different from each other and may include, for example, a square, rectangle, or arc.

Referring back to FIG. 1F, a first insulating layer 110a is then formed overlying the upper surface 100a of the semiconductor substrate 100, and a second insulating layer 110b is formed overlying the lower surface 100b, wherein the first insulating layer 110a has a material different from that of the second insulating layer 110b. In the following process, an opening exposing the conducting layer 106 will be formed in the second insulating layer 110b and a bonding structure, such as a solder ball, will be formed in the opening. During the research process, the inventor found that the second insulating layer 110b needs to be in contact with the outside environment more frequently compared with the first insulating layer 110a. Thus, it is preferable that the second insulating layer 110b has an environmental resistance superior to that of the first insulating layer 110a. For example, a second insulating layer 110b having an acid resistance higher than that of the first insulating layer 110a or a second insulating layer 110b having a water resistance higher than that of the first insulating layer 110a may be adopted. For example, the insulating layer 110a may include a liquid type material, such as an epoxy resin, polyimide, BCB, or combinations thereof, while the second insulating layer 110b may include a solder mask material, silicon oxide, silicon nitride, or combinations thereof.

In addition, in another embodiment, because a plurality of openings having smaller sizes need to be formed in the first insulating layer 110a in the following process and the opening of the second insulating layer has a relatively big size, a photosensitive insulating material having a better exposure resolution is chosen to form the first insulating layer 110a. A photosensitive insulating material having a normal exposure resolution is chosen to form the second insulating layer. The process mentioned above needs no additional resistance patterns, thus, manufacturing costs can be reduced. For example, the first insulating layer 110a may include a photosensitive insulating material having a better exposure resolution, such as a liquid epoxy resin, polyimide, BCB, or combinations thereof, while a photosensitive insulating material having a normal exposure resolution, such as a solder mask material, is chosen to form the second insulating layer 110b.

Figure 1F:
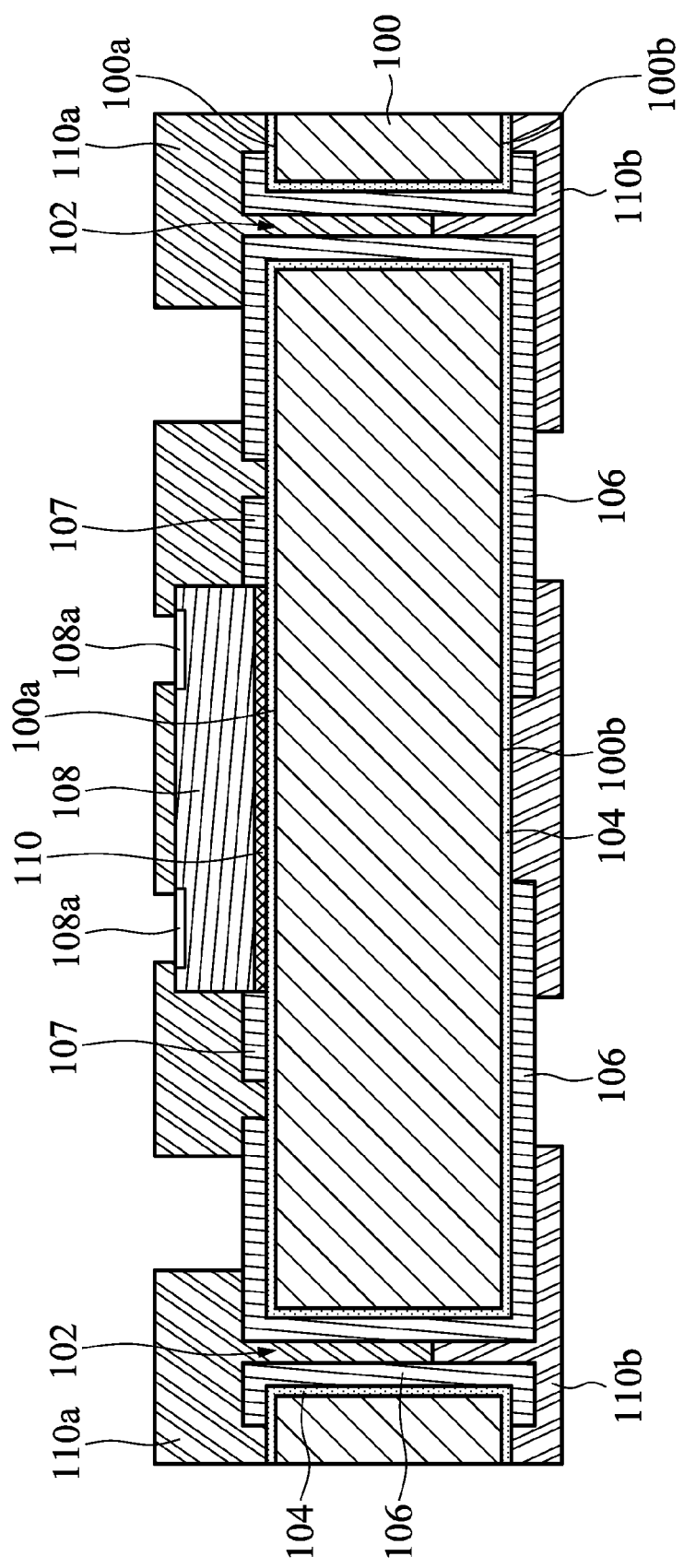

In the embodiment shown in FIG. 1F, the first insulating layer 110a and the second insulating layer 110b further extend overlying the conducting layer 106 on the sidewall of the through-hole 102. In one embodiment, the first insulating layer 110a and the second insulating layer 110b completely fill the through-hole 102. In one embodiment, the first insulating layer 110a extends into the through-hole 102 to a depth from the upper surface deeper than that of the second insulating layer 110b which extends into the through-hole from the lower surface. In this situation, a material having a better hole-filling ability is chosen to form the first insulating layer 110a, compared with the material used to form the second insulating layer 110b. For example, in one embodiment, a dry film having a better hole-filling ability may be chosen to form the first insulating layer 110a. For example, a dry film type epoxy resin, silicone, or combinations thereof may be adopted. An insulating material having a normal hole-filling ability, such as a solder mask material, silicon oxide, silicon nitride, or combinations thereof may be chosen to form the second insulating layer 110b.

The first insulating layer 110a and the second insulating layer 110b may be formed by, for example, a spin coating process, spray coating process, curtain coating process, or other suitable deposition processes, such as a liquid phase deposition, physical vapor deposition, chemical vapor deposition, low pressure chemical vapor deposition, plasma enhanced chemical vapor deposition, rapid thermal chemical vapor deposition, or atmospheric pressure chemical vapor deposition.

In one embodiment, it is preferable that the first insulating layer 110a and the second insulating layer 110b are formed by attaching dry films overlying the upper surface 100a and the lower surface 100b of the semiconductor substrate 100, respectively. Then, the dry films are softened to fill in the through-hole. Finally, the softened dry films are cured by a heat treatment. The forming of the preferable embodiment mentioned above is shown in FIGS. 3A-3B.

Figure 3A:
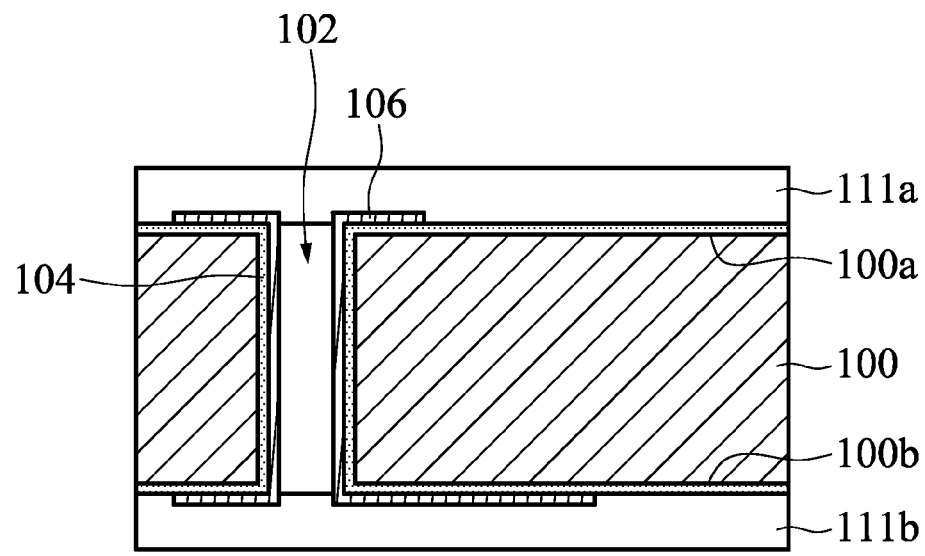
FIGS. 3A-3B are illustrative cross-sectional views showing the steps of forming an insulating layer of a chip package according to an embodiment of the present invention.

As shown in FIG. 3A, a first insulating film 111a and a second insulating film 111b are attached overlying the upper surface 100a and the lower surface 100b of the semiconductor substrate 100, respectively. In this embodiment, the first insulating layer 111a directly contacts with the dielectric layer 104 and the conducting layer 106 on the upper surface 100a while the second insulating film 111b directly contacts with the dielectric layer 104 and the conducting layer 106 on the lower surface 100b.

Figure 3B:
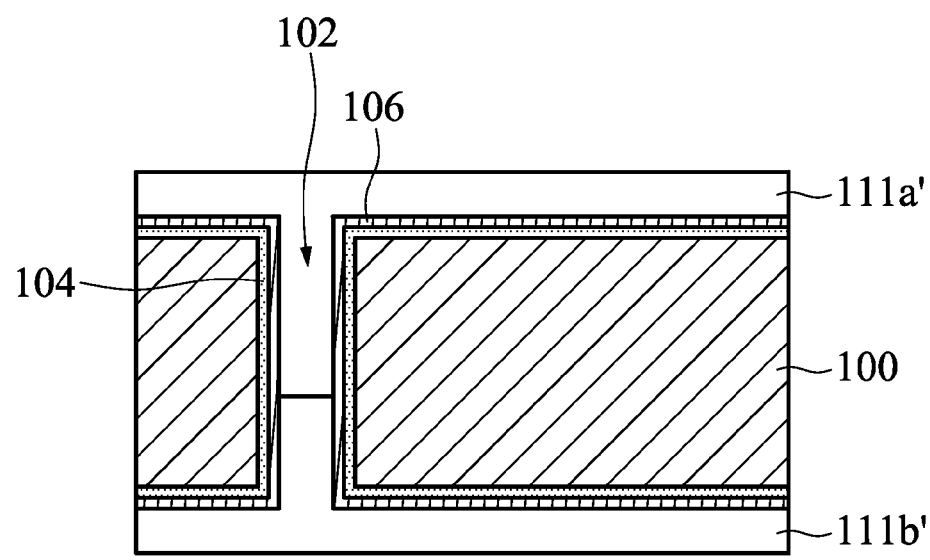

As shown in FIG. 3B, the first insulating film 111a and the second insulating film 111b are then heated. The heating temperature may be raised to be higher than the softening points of the first insulating film 111a and the second insulating film 111b, such that the first insulating film 111a and the second insulating film 111b are softened. Because the softened first insulating film 111a' and the softened second insulating film 111b' have fluid-like properties, they extend into the through-hole 102 and are located overlying the conducting layer 106 on the sidewall of the through-hole 102. In one embodiment, the first insulating film 111a' has a softening point lower than that of the second insulating film 111b'. Alternatively, the first insulating layer 111a' may have a fluidity higher than the second insulating film 111b'.

In the embodiment shown in FIG. 3B, the depth of the softened first insulating film 111a' extending into the through-hole 102 is thus deeper than that of the softened second insulating film 111b'. However, in another embodiment, the extended depth of the individual softened insulating film may be controlled by tuning the process factors, such as the heating temperature. Alternatively, a first insulating film and a second insulating film, which have softening points with relatively high difference, may be adopted. The heating temperature is only raised higher than the softening point of one of the insulating films, such that the through-hole 102 is substantially filled with a single softened insulating film, which afterward returns to be solid state. Then, a curing process is performed to form the first insulating layer 110a and the second insulating layer 110b as shown in FIG. 1F. In one embodiment, when the first insulating layer 110a and the second insulating layer 110b are polymer materials, the polymer materials may be hardened by a heat treatment which causes the polymer materials to become crosslinked. For example, the temperature may be kept at 150° C. to 300° C. for over 0.5 hours.

Referring to FIG. 1F, after the formation of the first insulating layer 110a and the second insulating layer 110b, the first insulating layer 110a and the second insulating layer 110b are patterned to form a plurality of openings therein, respectively. Because more openings with smaller sizes are formed in the first insulating layer 110a, a photosensitive insulating material with a higher exposure resolution may be chosen to form the first insulating layer 110a. Because the second insulating layer 110b needs to sustain the process of forming a bonding structure, the second insulating layer 110b needs to have a better environmental resistance. The openings of the patterned first insulating layer 110a may expose the conducting layer 106 extending over the upper surface 100a and the bond pad 108a of the chip 108. The openings of the second insulating layer 110b may expose the conducting layer 106 extending over the lower surface 100b.

Figure 1G:
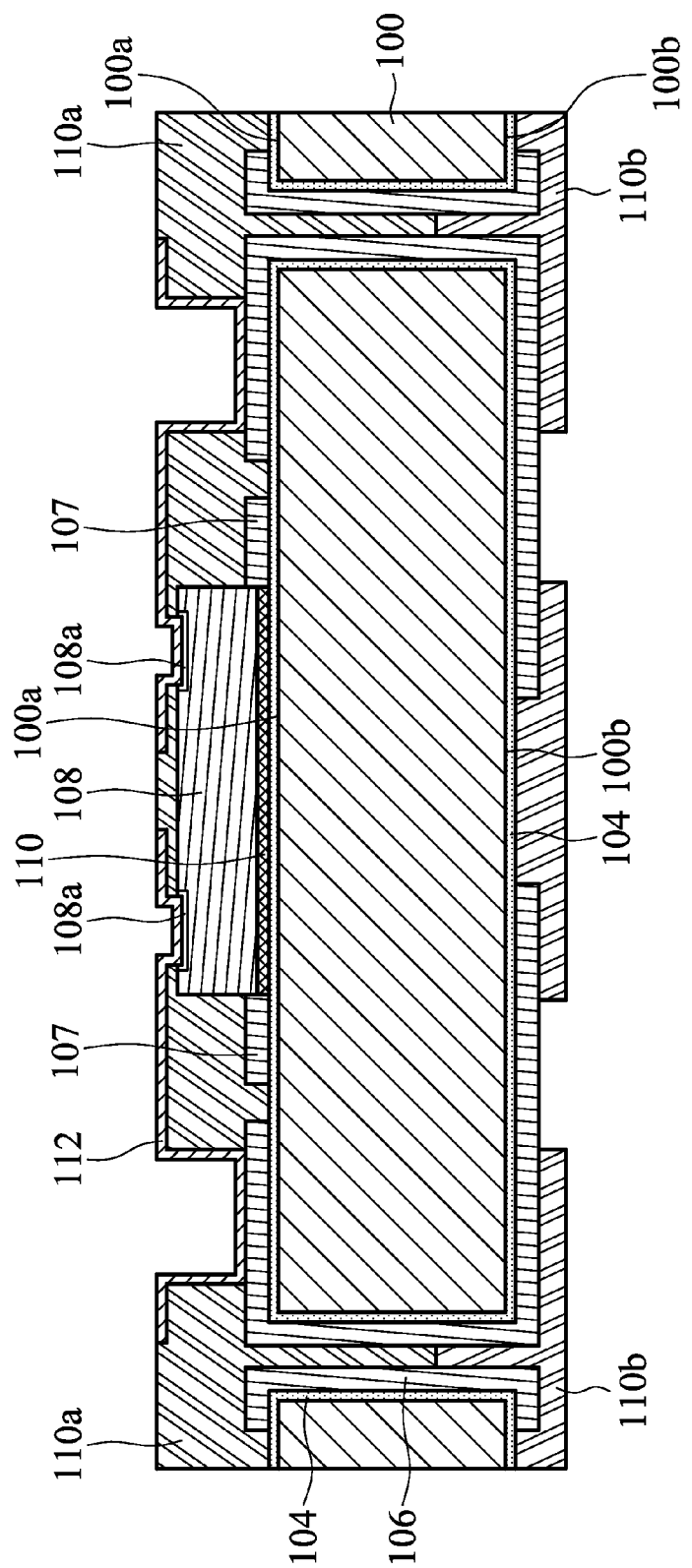

As shown in FIG. 1G, a redistribution layer 112 is formed overlying the bottom portion and the sidewall of the openings of the first insulating layer 110a. In this embodiment, the redistribution layer 112 directly and respectively contacts with the conducting layer 106 and the bond pad 108a of the chip 108 through the openings, and thus electrically couples with the chip 108 and the conducting layer 106. The redistribution layer 112 may be formed by a physical vapor deposition, chemical vapor deposition, electroplating, or electroless plating. The material of the redistribution layer 112 may be a metal material, such as a copper, aluminum, gold, or combinations thereof. The material of the redistribution layer 112 may also include a conducting oxide, such as an indium tin oxide, indium zinc oxide, or combinations thereof.

Figure 1H:
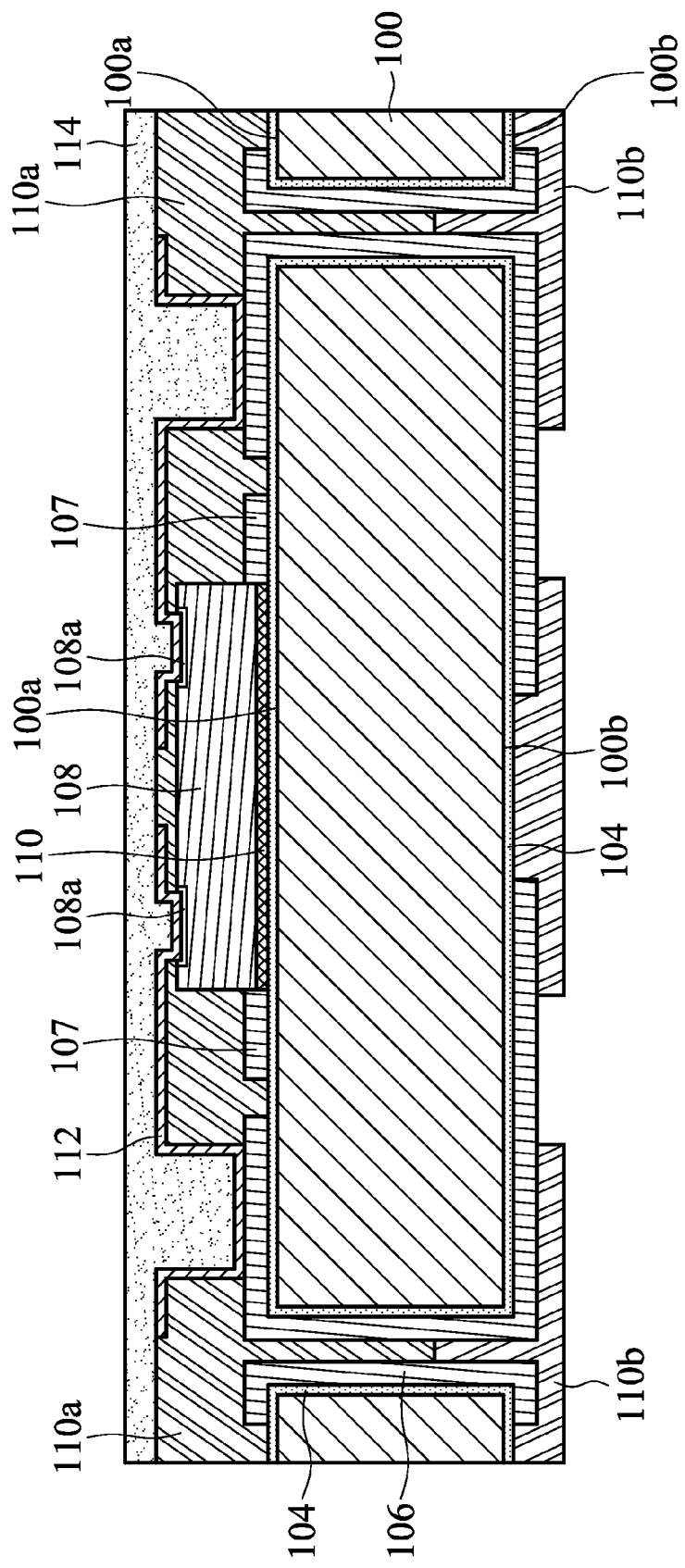

As shown in FIG. 1H, a third insulating layer 114 is formed overlying the semiconductor substrate 100. The third insulating layer 114 may include, for example, a solder mask material or other suitable insulating material. The third insulating layer 114 may be formed by attaching a dry film similar to that shown in FIGS. 3A-3B.

Figure 1I:
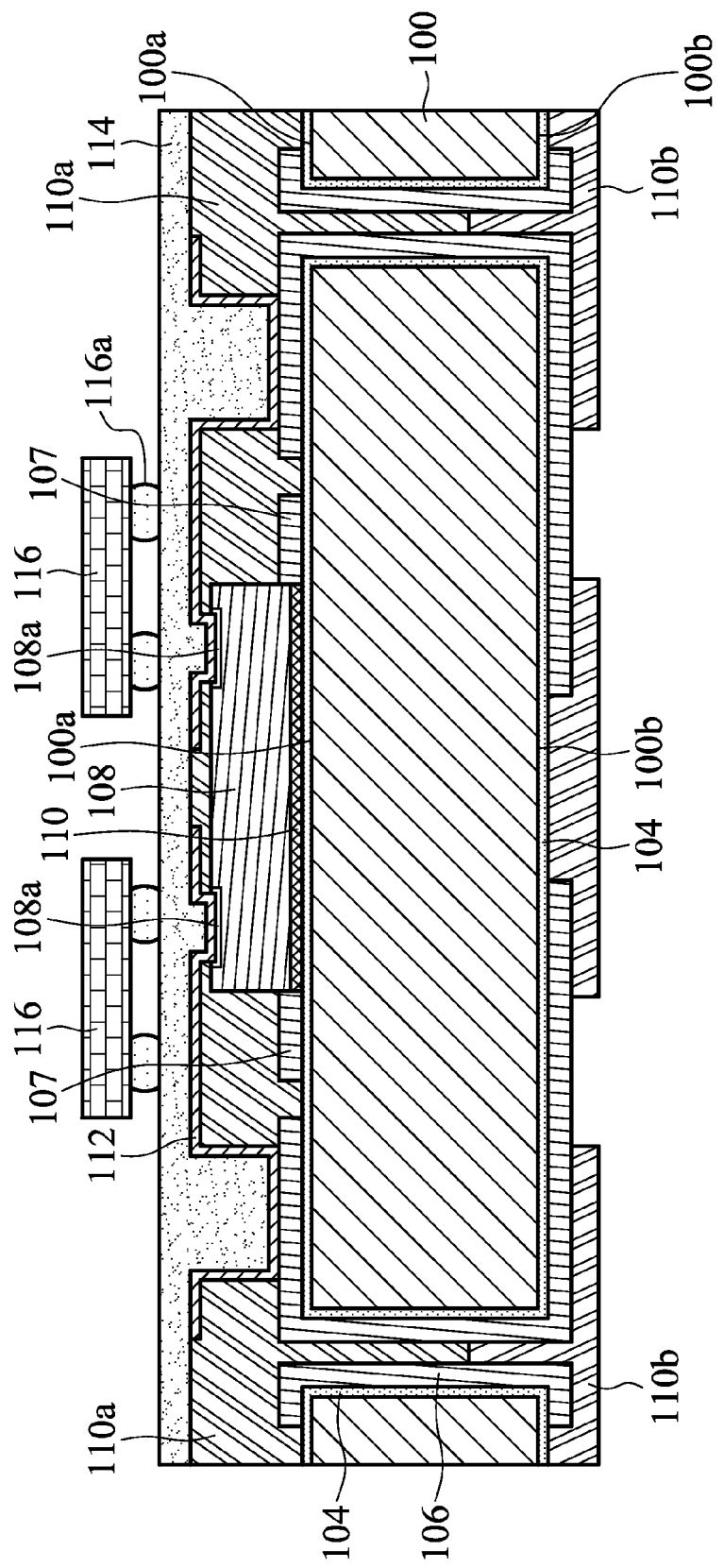

As shown in FIG. 1I, at least one chip 116 is then disposed overlying the third insulating layer 114. The chip 116 may be electrically coupled with the chip 108 through, for example, a solder ball 116a, a redistribution layer formed in the third insulating layer 114 (not shown), and the redistribution layer 112. Thus, electrical signals may be transmitted between the chips 116 and 108. The chips 116 and 108 may work together.

The function of the chip 116 may differ from that of the chip 108. The chip 116 may include a logic chip, micro electro mechanical system (MEMS) chip, micro fluidic system chip, physical sensor chip for detecting physical changes such as detecting heat, light, or pressure, RF device chip, accelerator chip, gyroscope chip, micro actuator chip, surface acoustic wave device chip, pressure sensor chip, ink printer head chip, light emitting device chip, or solar cell chip. In addition, more chips having other functions may further be disposed. Through the stacking method shown in FIG. 1I, chips having a variety of functions may be integrated in a limited area to obtain a desired product. In addition to saving wafer area and reducing manufacturing cost, transmission distance of signals may further be reduced through the vertical electrical path which further increases the speed of signal transmission and enhances product performance.

Figure 1J:
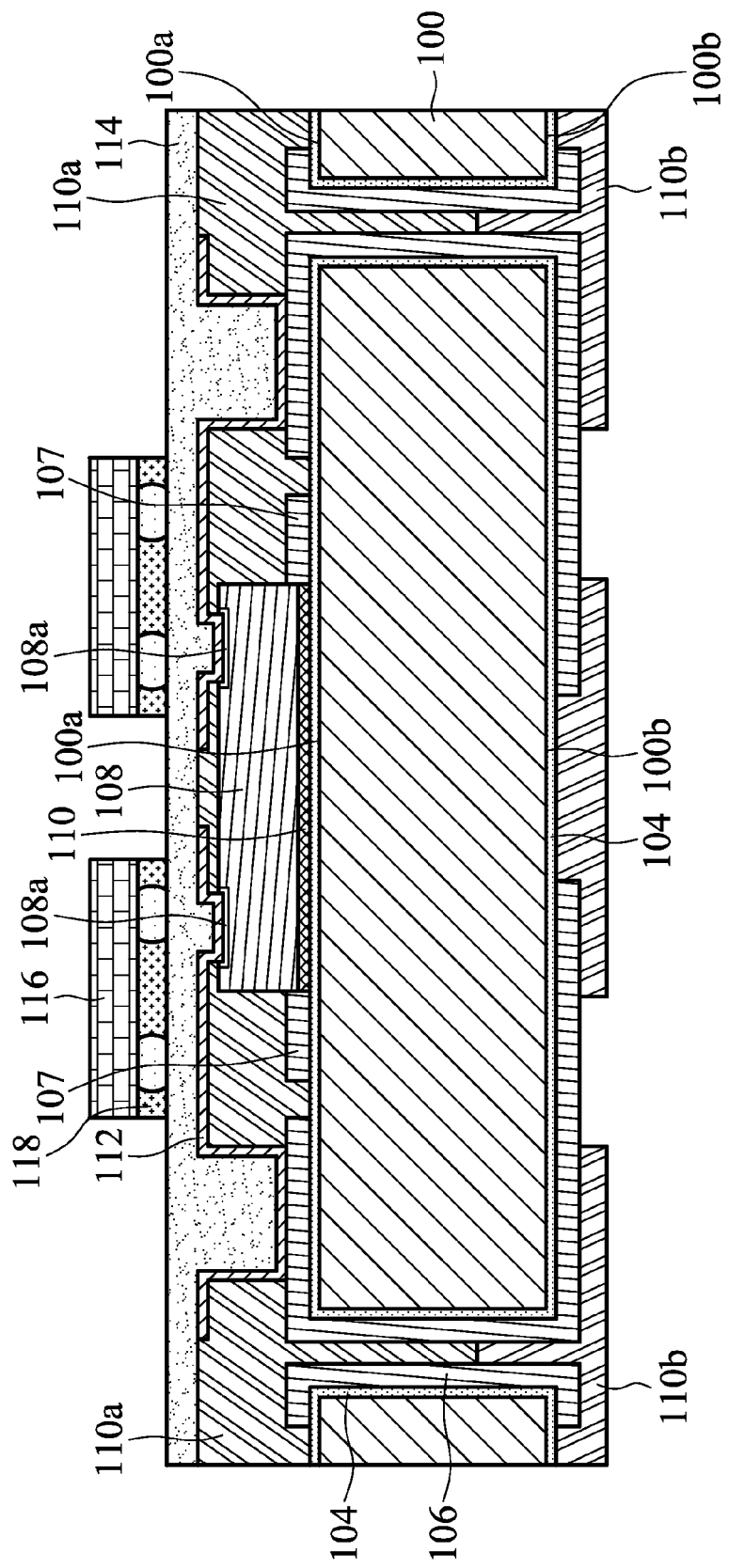
Figure 1K:
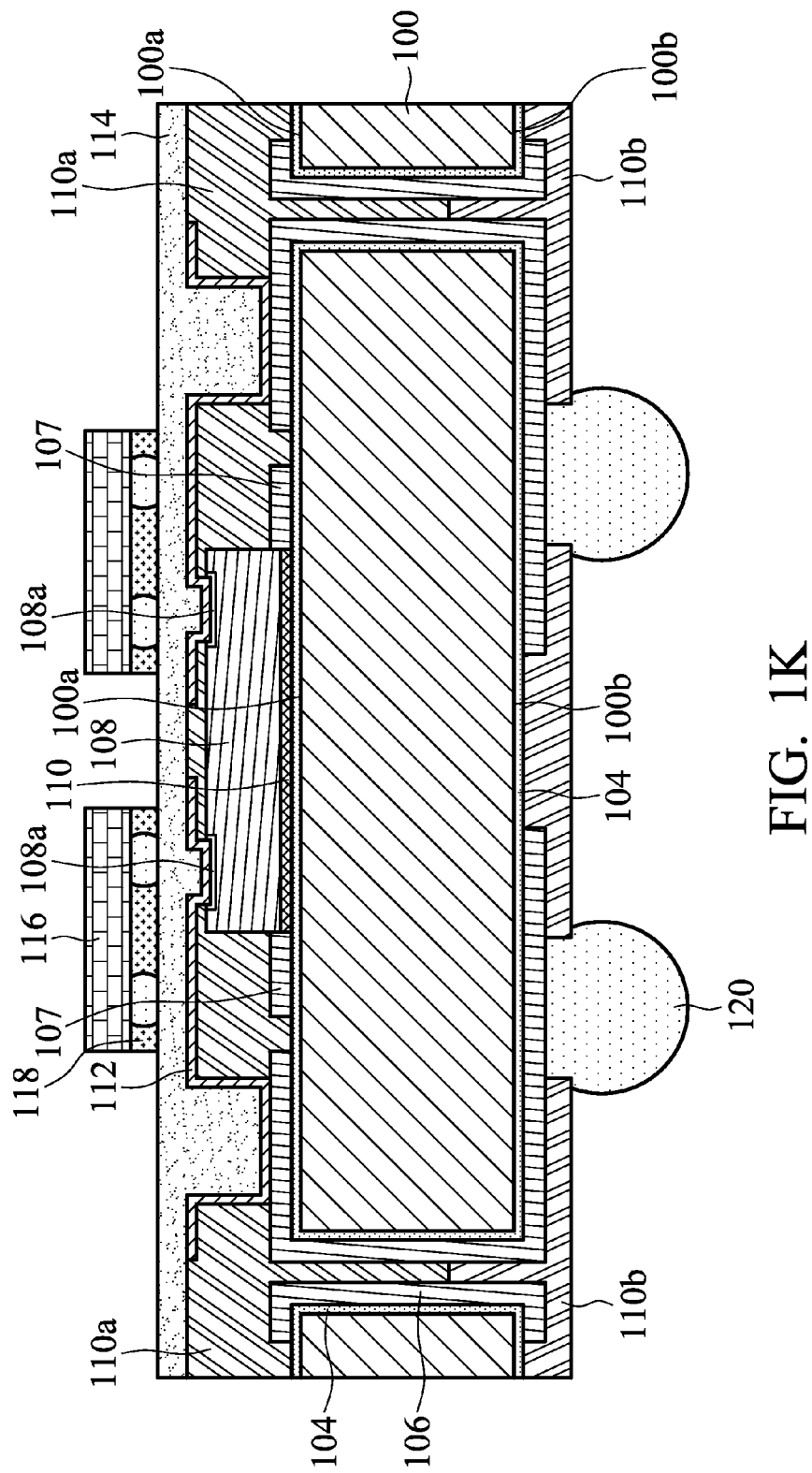

As shown in FIG. 1J, an underfill 118 is then formed under the chip 116 to fix and protect the chip 116. Then, as shown in FIG. 1K, a bonding structure 120 is formed in the opening of the second insulating layer 110b. In this embodiment, the bonding structure 120 is a conductive bonding structure, such as a solder ball. The bonding structure 120 may be electrically connected to the conducting layer 106 through the opening in the second insulating layer 110b. Thus, when the bonding structure 120 is a conductive bonding structure, the bonding structure may be electrically connected to the chips 108 and 116 through the conducting layer 106 and the redistribution layer 112, respectively or simultaneously. In addition, the chip package of the invention may be further disposed on other electronic element through the bonding structure 120. For example, the chip package may be disposed on a printed circuit board using flip-chip technology.

Figure 4:
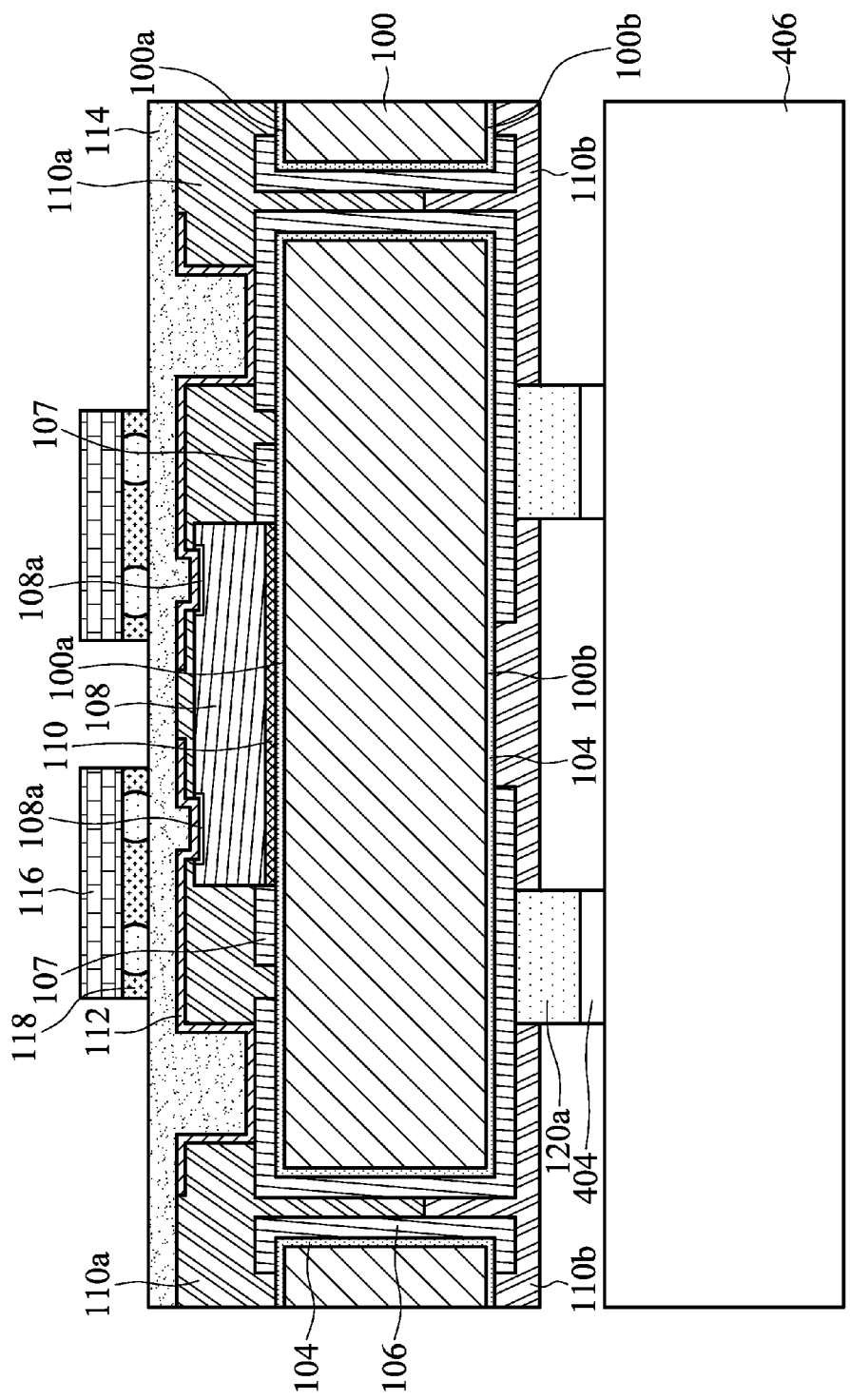
FIG. 4 is an illustrative cross-sectional view showing a chip package according to an embodiment of the present invention.

In addition, in another embodiment, a cap plate may be disposed overlying the lower surface of the semiconductor substrate through the bonding structure. For example, in the chip package of an embodiment shown in FIG. 4, a cap plate 406 is disposed overlying the lower surface 100b of the semiconductor substrate 100 through a bonding structure 120a, such as a metal bump. Metal pads 404 may be formed on the cap plate 406 in advance for bonding with the bonding structure 120a. For example, when the material of the bonding structure 120a is a metal, a heating process may be performed to induce a eutectic bonding or diffusion bonding between the bonding structure and the metal pads 404. However, when it is not necessary to form a conducting path between the cap plate 406 and the chip package, materials other than a metal may also be adopted for bonding.

In one embodiment, the cap plate 406 may be, for example, a transparent plate having a material, such as a glass, quartz, opal, plastic, or any other transparent substrate. In this case, the semiconductor substrate 100 may be or include, for example, a photosensitive chip or light emitting chip, such as an image sensor chip, light emitting diode chip, or solar cell chip.

The formation of the chip package according to embodiments of the invention is described with reference to the accompanying drawings. However, it should be appreciated that the sequence of the process steps described is only an example of the invention and may be partially changed. Alternatively, other process steps may be added between the process steps depending on the requirement.

In the chip package of the embodiment of the invention, a variety of chips may be integrated in a vertical direction through the vertical conducting path formed in the through-hole, thus reducing manufacturing cost, reducing product size, and improving product performance. Through forming insulating layers with two different materials on the upper and lower surfaces of the semiconductor substrate, the process issue and reliability of the package may both be considered. Through disposing of the self-aligned wall, the position of the disposed chip may be controlled, improving product yield of the package.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A chip package, comprising:
 a semiconductor substrate having an upper surface and an opposite lower surface;
 a through-hole penetrating the upper surface and the lower surface of the semiconductor substrate;
 a first chip disposed overlying the upper surface of the semiconductor substrate;
 a conducting layer overlying a sidewall of the through-hole and electrically connecting the first chip;
 a first insulating layer overlying the upper surface of the semiconductor substrate;
 a second insulating layer overlying the lower surface of the semiconductor substrate, wherein a material of the second insulating layer is different from that of the first insulating layer;
 a bonding structure disposed overlying the lower surface of the semiconductor substrate; and
 a self-aligned wall located on the upper surface of the semiconductor substrate and adjacent to or contacted with the first chip, wherein a distance between a top surface of the self-aligned wall and the upper surface of the semiconductor substrate is larger than a distance between a bottom surface of the first chip and the upper surface of the semiconductor substrate.

2. The chip package as claimed in claim 1, wherein the first insulating layer and the second insulating layer extend into the through-hole, respectively.

3. The chip package as claimed in claim 1, wherein the first insulating layer extends into the through-hole to a depth from the upper surface deeper than that of the second insulating layer extending into the through-hole from the lower surface.

4. The chip package as claimed in claim 3, wherein the first insulating layer has a softening point lower than that of the second insulating layer.

5. The chip package as claimed in claim 1, wherein the first insulating layer has an exposure resolution higher than that of the second insulating layer.

6. The chip package as claimed in claim 1, wherein the self-aligned wall is a discontinuous structure comprising at least a first portion and a second portion, wherein the first portion and the second portion are disposed beside the first chip and opposite to each other.

7. The chip package as claimed in claim 1, wherein the self-aligned wall comprises a conducting material.

8. The chip package as claimed in claim 1, further comprising a second chip disposed overlying the first insulating layer and the first chip, and the second chip is electrically coupled with the first chip.

9. The chip package as claimed in claim 8, further comprising a third insulating layer formed between the second chip and the first chip.

10. The chip package as claimed in claim 1, further comprising:
an opening formed in the first insulating layer; and
a redistribution layer formed on a bottom and a sidewall of the opening, the redistribution layer electrically connecting the first chip and the conducting layer.

11. The chip package as claimed in claim 1, wherein the self-aligned wall and the conducting layer are metal material formed simultaneously.

12. The chip package as claimed in claim 1, wherein the semiconductor substrate is a chip.

13. The chip package as claimed in claim 12, further comprising a cap plate disposed on the lower surface of the semiconductor substrate through the bonding structure.

14. The chip package as claimed in claim 3, wherein the first insulating layer and the second insulating layer are formed from a first material and a second material, respectively, and the first material has fluidity higher than that of the second material.

15. A chip package, comprising:
a semiconductor substrate having an upper surface and an opposite lower surface;
a through-hole penetrating the upper surface and the lower surface of the semiconductor substrate;
a first chip disposed overlying the upper surface of the semiconductor substrate;
a conducting layer overlying a sidewall of the through-hole and electrically connecting the first chip;
a first insulating layer overlying the upper surface of the semiconductor substrate;
a second insulating layer overlying the lower surface of the semiconductor substrate, wherein a material of the second insulating layer is different from that of the first insulating layer;
a bonding structure disposed overlying the lower surface of the semiconductor substrate; and
a self-aligned wall located on the upper surface of the semiconductor substrate and adjacent to or contacted with the first chip, wherein the self-aligned wall is a continuous ring structure surrounding the first chip.

16. A method for forming a chip package, comprising:
providing a semiconductor substrate having an upper surface and an opposite lower surface;
forming a through-hole in the semiconductor substrate, the through-hole penetrating the upper surface and the lower surface of the semiconductor substrate;
forming a conducting layer on a sidewall of the through-hole, the conducting layer extending overlying the semiconductor substrate;
disposing a first chip overlying the upper surface of the semiconductor substrate, the first chip electrically coupled with the conducting layer;
forming a first insulating layer overlying the upper surface of the semiconductor substrate;
forming a second insulating layer overlying the lower surface of the semiconductor substrate, wherein the second insulating layer has a material different from that of the first insulating layer, wherein the forming of the first insulating layer and the second insulating layer comprises:
attaching a first insulating film and a second insulating film on the upper surface and the lower surface of the semiconductor substrate, respectively;
heating the first insulating film and the second insulating film such that the first insulating film and the second insulating film are softened and extended overlying the conducting layer on the sidewall of the through-hole; and
hardening the softened first insulating film and the second insulating film to form the first insulating layer and the second insulating layer, respectively; and
disposing a bonding structure overlying the lower surface of the semiconductor substrate.

17. The method for forming a chip package as claimed in claim 16, wherein the first insulating layer and the second insulating layer extend into the through-hole, respectively, and the first insulating layer extends into the through-hole to a depth from the upper surface deeper than that of the second insulating layer extending into the through-hole from the lower surface.

18. The method for forming a chip package as claimed in claim 16, further comprising forming a self-aligned wall on the upper surface of the semiconductor substrate, the self-aligned wall adjacent to or contacted with the first chip.

19. The method for forming a chip package as claimed in claim 18, wherein the self-aligned wall and the conducting layer are formed simultaneously.

20. The method for forming a chip package as claimed in claim 16, further comprising disposing a second chip disposed overlying the first insulating layer and the first chip, the second chip electrically coupled with the first chip.

21. The method for forming a chip package as claimed in claim 16, wherein the semiconductor substrate is a chip.

22. The method for forming a chip package as claimed in claim 18, wherein a distance between a top surface of the self-aligned wall and the upper surface of the semiconductor substrate is larger than a distance between a bottom surface of the first chip and the upper surface of the semiconductor substrate.

* * * * *